United States Patent
Koyama et al.

(10) Patent No.: US 6,365,905 B1
(45) Date of Patent: Apr. 2, 2002

(54) FOCUSED ION BEAM PROCESSING APPARATUS

(75) Inventors: Yoshihiro Koyama; Kazuo Aita, both of Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 09/324,264

(22) Filed: Jun. 2, 1999

(30) Foreign Application Priority Data

Jun. 3, 1998 (JP) .............................. 10-154720

(51) Int. Cl.$^7$ .............................................. H01J 37/317
(52) U.S. Cl. ............. 250/492.21; 250/309; 250/441.11; 250/443.1; 118/723 FI
(58) Field of Search ........................... 250/492.21, 309, 250/441.11, 443.1; 118/723 FI

(56) References Cited

U.S. PATENT DOCUMENTS 5,747,818 A * 5/1998 Cecere .................. 250/492.21
5,840,630 A * 11/1998 Cecere et al. ................ 438/712
5,854,488 A * 12/1998 Aita ............................ 250/309

* cited by examiner

Primary Examiner—Bruce Anderson
Assistant Examiner—Nikita Wells
(74) Attorney, Agent, or Firm—Hogan & Hartson, L.L.P.

(57) ABSTRACT

In a charged particle beam apparatus comprising an ion optical system 3 for focusing ions, a secondary charged particle detector 7 for detecting secondary charged particles produced by beam irradiation of scanning a focused ion beam 2 focused by the ion optical system 3 to a predetermined region of a sample 5, a display unit 9 for displaying an image of the sample surface 5 based on a signal of the secondary charged particle detector, and a gas injector 4 for blowing a gas to the sample surface 5, a focused ion beam processing apparatus is characterized by conducting processing by cooling a gas trap provided between a reservoir 13 or cylinder 18 and a valve 12 to control an assist gas having a high vapor pressure and blowing it through the gas injector 4 simultaneously with irradiating a focused ion beam.

20 Claims, 2 Drawing Sheets

FOCUSED ION BEAM PROCESSING APPARATUS

BACKGROUND OF THE INVENTION

The present invention relates to a focused ion beam apparatus to perform ion beam processing, such as film processing, etch processing, selective etch processing or the like, when a focused ion beam is scanned to a predetermined region of a sample placed in a vacuum tank while simultaneously blowing an assist gas to the predetermined region.

In a focused ion beam apparatus using an assist gas, a sublimate substance in a solid or powder form packed as an assist gas material within a reservoir. The reservoir is heated up and the pressure inside the reservoir is controlled. The assist gas under pressure control is passed through a valve and supplied to a vacuum tank through an gas injector. The flow rate of the gas from the gas injector is determined by reservoir pressure, gas injector conductance and vacuum tank pressure. Accordingly, the flow rate of the gas through the gas injector is controlled by controlling the reservoir pressure constant.

Also, for the substance having a vapor pressure of 400 Torr or higher at room temperature (20 degrees), the flow rate of an assist gas is controlled by a mass flow controller or control valve for vacuum degree control. The assist gas is passed through the valve and supplied to the gas injector through a gas injector.

Problems that the Invention is to Solve

The conventionally implemented reservoir gas supply system for a focused ion beam apparatus using an assist gas, the pressure is controlled by utilizing material gas vapor pressure. Accordingly, the high vapor pressure material that is gaseous or liquidated form at room temperature could not be employed as a material for an assist gas.

Also, even if a mass flow controller be used, the flow rate was difficult to control at constant where a primary pressure and a secondary pressure had a low differential pressure or the flow rate was slight in amount.

SUMMARY OF THE INVENTION

In order to solve the above problem, the reservoir or the like is cooled/controlled to a constant temperature of –50° C. or below so that the assist gas material has a vapor pressure usable in a low state. An assist gas controlled in flow rate is supplied to an inside of a vacuum tank.

DESCRIPTION OF THE REFERENCE NUMERALS

Figure 1:
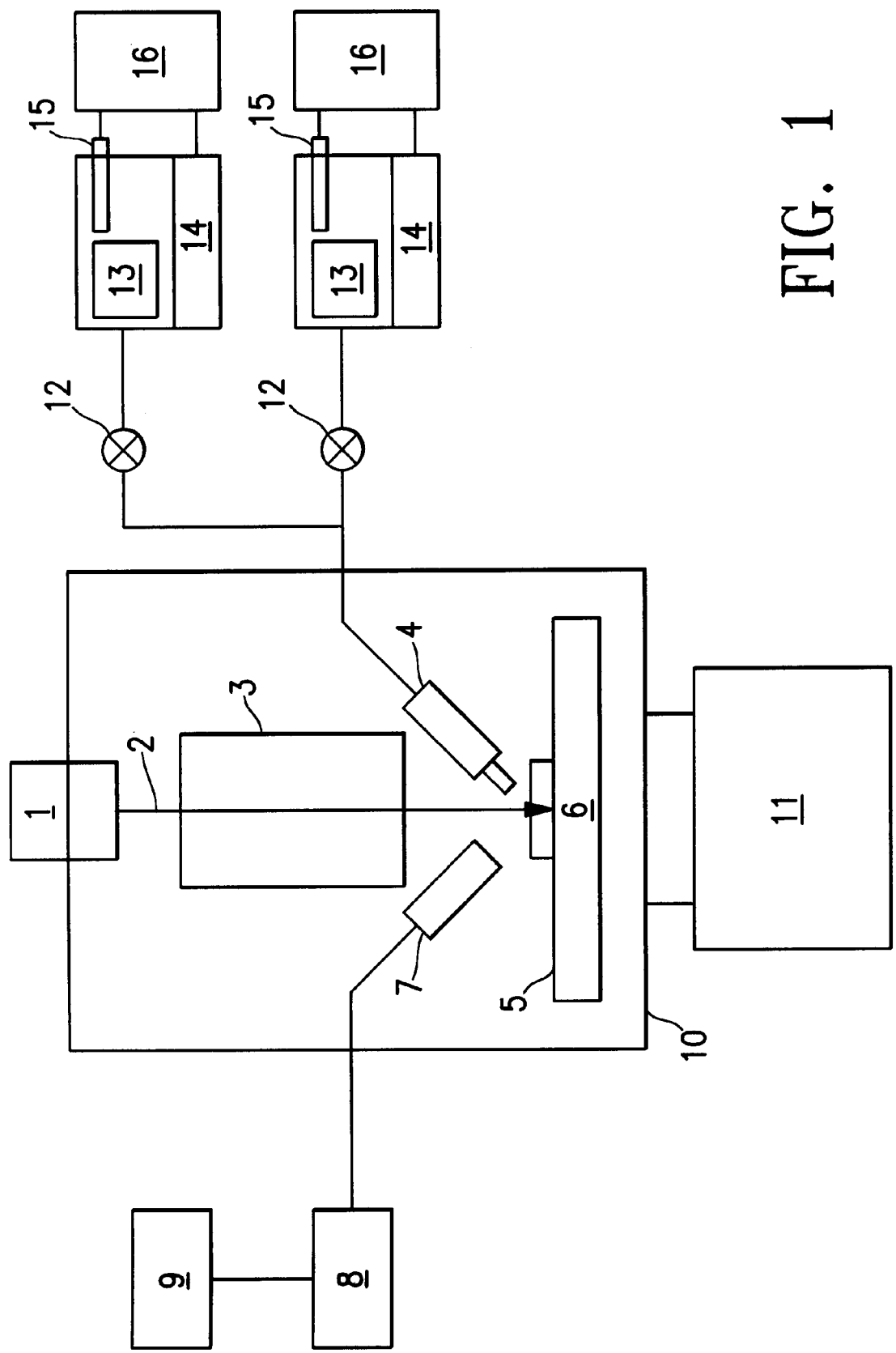
FIG. 1 is a view for showing an embodiment of the present invention.

1 . . . ion source
2 . . . focused ion beam
3 . . . ion optical system
4 . . . gas injector
5 . . . sample
6 . . . stage
7 . . . detector
8 . . . A/D converter
9 . . . display unit
10 . . . vacuum tank
11 . . . vacuum pump
12 . . . valve
13 . . . reservoir
14 . . . cooling unit
15 . . . temperature sensor
16 . . . temperature controller
17 . . . gas trap
18 . . . reservoir or cylinder
19 . . . flow rate adjusting device
20 . . . stop valve

DETAILED DESCRIPTION OF THE INVENTION

Hereinunder, an embodiment of the present invention will be explained using the drawings.

FIG. 1 shows a focused ion beam processing apparatus according to the present invention. Within the vacuum tank 10 evacuated by a vacuum pump 11, the ions caused from an ion source 1 are collected by an ion optical system 3 to irradiate a focused ion beam 2 to a sample 5 on a stage 6. The secondary charged particles caused from the sample 5 are detected by a detector 7. Through an A/D converter 8, a surface of the sample 5 is imaged by a display unit 9. Based on the imaging, a processing region is determined on the sample 5. When processing the sample 5 by the focused ion beam 2, an assist gas is blown through a gas injector 4.

A reservoir 13 packed with a high evaporation pressure material is cooled by a cooling unit 14 such as Peltier element or crya device. The temperature of the reservoir 13 is measured by a temperature sensor 15 such as a thermocouple, the cooling unit 14 such as Peltier element or cryo device is controlled by a temperature controller 16 based on a measured temperature to bring the evaporation pressure of the assist gas to a desired pressure. Thus the temperature of the reservoir 13 is controlled to a desired constant temperature.

The evaporation pressure of the assist gas within the reservoir 13 controlled to a constant temperature in kept constant with a low evaporation pressure. Ion beam processing is conducted with the assist gas by blowing onto the sample 5 through the valve 12 and the gas injector 4.

Figure 2:
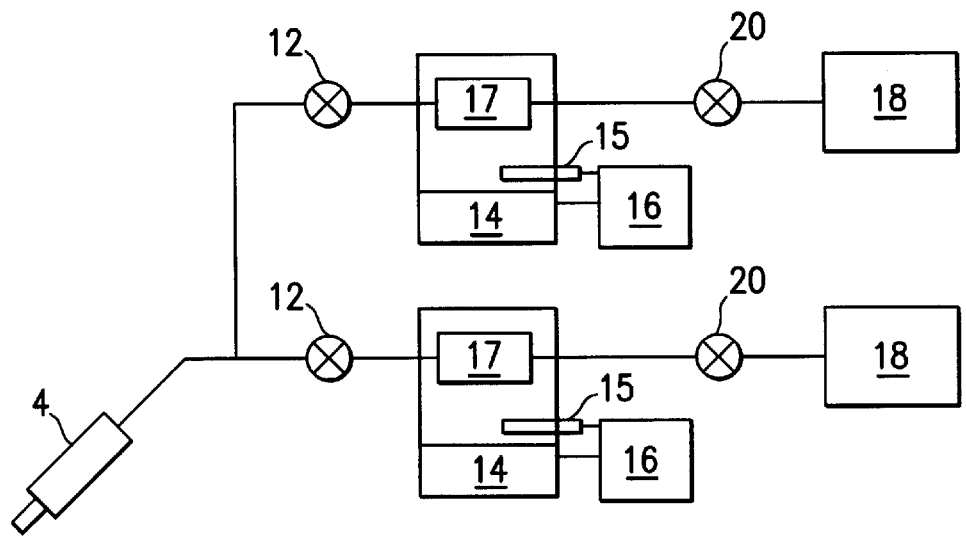
FIG. 2 is a view for explaining an assist gas supply system for a case provided with a gas trap.

Also, where using a cylinder or large capacity reservoir 18, the entire cylinder or reservoir 18 is difficult to be kept at a temperature of –50° C. or below. For this reason, as shown in FIG. 2 a gas trap 17 is provided between valve 12 and the cylinder 18. In a state that the same portion is previously cooled by the cooling unit 14 such as a Peltier element or cryo device, a stop valve 20 is opened to temporarily adsorb the assist gas in the gas trap 17. The stop valve 20 is closed, and the temperature of the gas trap 17 is cooled/adjusted to a desired pressure. Through the valve 12 and the gas injector 4, ion beam processing is performed by blowing an assist gas onto the sample 5.

Figure 3:
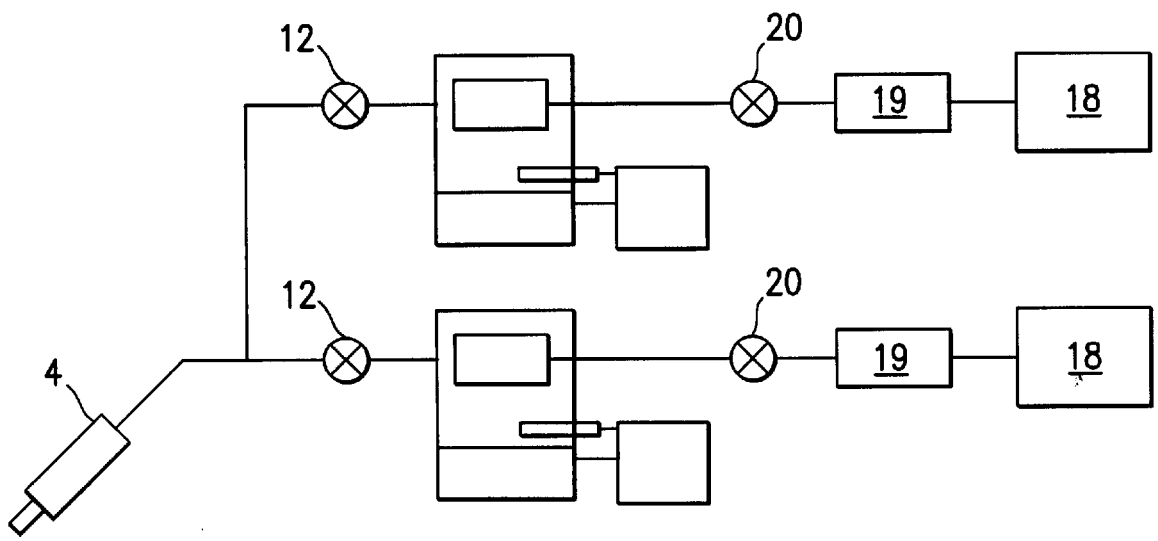
FIG. 3 is a view for explaining the assist gas supply system for a case a flow rate adjusting device is provided at a front stage of the gas trap.

Also, as shown in FIG. 3 a flow rate adjusting device 19 such as a mass flow control or vacuum-controlling control valve may be provided at a front stage or rear stage of the gas trap 17. It is possible to conduct flow rate adjustment upon adsorbing the gas in the gas trap 17 or flow rate adjustment upon blowing onto the sample 5 the gas adsorbed in the gas trap 17 through the valve 12 and the gas injector 4. FIG. 3 shows a case that a flow rate adjusting device 19 is provided at a front stage of the gas trap 17.

Effect of the Invention

As stated above, according to the present invention, even one in a gaseous of liquefied form at room temperature or one having very high vapor pressure can be supplied as an assist gas to the vacuum tank through the gas injector whereby ion beam processing such as film processing, etch processing, selective etch processing, etc. can be performed while blowing an assist gas to a predetermined region.

What is claimed is:

1. A focused ion beam forming apparatus comprising:

a vacuum tank;

a gas injector for supplying an assist gas to a predetermined region of a surface of a sample, wherein one or more reservoirs supply the assist gas;

a device for cooling at least one of the reservoirs;

a temperature sensor for measuring a temperature of the reservoir;

a temperature controller for controlling the temperature of the reservoirs by a measured value of the temperature sensor; and a valve provided between the reservoirs and the gas injector, the reservoirs having the cooling device and the temperature sensor being packed by a substance having a vapor pressure of higher than 1 Torr at room temperature to control the temperature of the reservoirs to a constant temperature of −50° C. or below thereby controlling an amount of the assist gas to be blown to the predetermined region.

2. In a focused ion beam apparatus in claim 1, in an assist gas supply unit provided by a gas injector for supplying an assist gas to the predetermined region, a nozzle that the gas injector blows the assist gas, one or more reservoirs as a supply source of the assist gas and gas traps provided between the reservoirs and the gas injector, and structured by a cooling element or device for at least one of the gas traps, a temperature sensor for measuring temperatures of the gas traps, a temperature controller for controlling the temperatures o the reservoirs by a measurement value of the temperature sensor and a valve provided between the reservoirs and the gas injector, the focused ion beam processing apparatus storing a substance having a vapor pressure of 1 Torr or higher at room temperature within the gas traps provided with the cooling element or devices and the temperature sensor whereby the temperatures of the gas traps are controlled to thereby control an amount of the assist gas to be blown to the predetermined region.

3. A focused ion beam apparatus comprising:

a reservoir containing an assist gas supply; and a cooling unit coupled to said reservoir which cools said reservoir to a constant temperature of −50° C. or below to control an amount of assist gas to be blown on a predetermined region.

4. The apparatus according to claim 3, wherein the cooling unit is a Peltier element.

5. The apparatus according to claim 3, wherein the cooling unit is a cryo device.

6. The apparatus according to claim 3 further comprising a temperature sensor for measuring the temperature of the reservoir.

7. The apparatus according to claim 3 further comprising a temperature controller for controlling the cooling unit.

8. The apparatus according to claim 3 further comprising a gas trap provided between a valve and the reservoir.

9. The apparatus according to claim 8 further comprising a stop valve to temporarily adsorb the assist gas in the gas trap.

10. A focus ion beam processing method comprising the steps of:

irradiating a sample with an ion beam;

maintaining a constant temperature of a reservoir for generating an assist gas; and directing the assist gas from a gas injector to the sample, simultaneously with irradiating the focus beam, wherein the temperature of the reservoir is maintained at a temperature of −50° C. or below to control an amount of the assist gas blown to the sample.

11. The method according to claim 10 further comprising the step of measuring the temperature of the reservoir.

12. The method according to claim 10 further comprising the step of cooling the reservoir with a cooling unit.

13. The method according to claim 12 further comprising the step of controlling the temperature of the cooling unit with a temperature controller.

14. The method according to claim 10 further comprising the step of maintaining the pressure of the assist gas at a low evaporation pressure.

15. The method according to claim 10 further comprising the step of providing a gas trap between a valve unit and the reservoir.

16. The method according to claim 15 further comprising the step of opening a stop valve to temporarily adsorb the assist gas in the trap.

17. The method according to claim 15 further comprising the step of adjusting the flow rate of the assist gas with a flow rate adjusting device provided at a front stage of the gas trap.

18. The method according to claim 17 further comprising the step of adjusting the flow rate of the assist gas bay adsorbing the assist gas in the gas trap.

19. The method according to claim 17 further comprising the step of adjusting the flow rate of the assist gas by blowing onto the sample, the gas adsorbed in the gas trap through the valve and the gas injector.

20. The method according to claim 15 further comprising the step of adjusting the flow rate of the assist gas with a flow rate adjusting device provided at a rear stage of the gas trap.

* * * * *